US008571830B2

(12) United States Patent
Bal et al.

(10) Patent No.: US 8,571,830 B2
(45) Date of Patent: Oct. 29, 2013

(54) METHOD AND SYSTEM FOR DETECTION OF COLLECTOR FLASHOVER

(75) Inventors: Debasis Bal, Bangalore (IN); Paul August Quail, Ballston Lake, NY (US); Sudhanshu Rai, Bangalore (IN); Larry Weldon Dill, Roswell, GA (US)

(73) Assignee: General Electric Company, Niskayuna, NY (US)

(*) Notice: Subject to any disclaimer, the term of this patent is extended or adjusted under 35 U.S.C. 154(b) by 230 days.

(21) Appl. No.: 12/824,270

(22) Filed: Jun. 28, 2010

(65) Prior Publication Data

US 2011/0320169 A1  Dec. 29, 2011

(51) Int. Cl.
*G21C 17/00* (2006.01)
(52) U.S. Cl.
USPC ............................................ 702/183; 702/34
(58) Field of Classification Search
USPC .................... 702/34, 179, 181, 182, 183, 189
See application file for complete search history.

(56) References Cited

U.S. PATENT DOCUMENTS

| 4,163,227 | A | | 7/1979 | Sawada et al. |
| 4,451,786 | A | * | 5/1984 | Sawada et al. ........... 324/765.01 |
| 6,034,531 | A | * | 3/2000 | Senglat et al. ................ 324/699 |
| 6,047,119 | A | | 4/2000 | Kappenman et al. |
| 7,161,493 | B2 | | 1/2007 | Itou et al. |
| 7,529,644 | B2 | | 5/2009 | Lenz et al. |
| 2005/0137834 | A1 | * | 6/2005 | Heydt et al. ................... 702/189 |
| 2008/0249743 | A1 | | 10/2008 | Hirohata et al. |
| 2010/0070441 | A1 | * | 3/2010 | Yuta ................................ 706/12 |

FOREIGN PATENT DOCUMENTS

| JP | 57084370 A | 5/1982 |
| WO | 2007040406 A1 | 4/2007 |

* cited by examiner

*Primary Examiner* — Sujoy Kundu
*Assistant Examiner* — Harun Chowdhury
(74) *Attorney, Agent, or Firm* — Seema S. Katragadda

(57) ABSTRACT

A system, method and computer program product for predicting collector flashover is disclosed. The method includes receiving a frame of measured data from a data acquisition system, fitting a statistical model to the measured data wherein the measured data includes a plurality of measured variables measured at multiple time instances. The statistical model and the measured data are used for estimating one or more parameters for the frame wherein the one or more parameters include at least one of field circuit impedance and field current noise. A flashover is predicted based, at least in part, upon the one or more estimated parameter for the frame.

12 Claims, 4 Drawing Sheets

METHOD AND SYSTEM FOR DETECTION OF COLLECTOR FLASHOVER

BACKGROUND

The present invention generally relates to an electric generator and specifically, to a method and a system for detecting collector flashover.

Generators are an indispensible part of power systems and are extensively used for power generation. Generators work on the principle of electromagnetic induction. A rotating magnetic field is generated either by a set of permanent magnets or electromagnets. Magnetic flux of the rotating magnetic field is linked to stationary coils. Due to rotation of the magnetic field, the flux linked to stationary coils varies in a sinusoidal fashion, causing a sinusoidal variation of voltage across the terminals of the stationary coils.

Typically, the stator of a generator is provided with slots for winding the stationary coils. The rotor is provided with magnets for generating a rotating magnetic field. The magnets disposed in the rotor may be permanent magnets or electromagnets. In most generators electromagnets are provided. To magnetize the electromagnets a current is applied on rotor coils wound over the said electromagnets. For continuous flow of current in the rotor coils one or more collector rings and brush arrangements are used. Under normal operation, the brushes maintain an optimum pressure on the collector rings so that the circuit is always closed.

In due course of time, the pressure of the brushes on the collector rings is reduced. Also, the collector rings and the brushes undergo continuous wear and tear that sometimes results in gaps between the collector ring and the brush. Arcing may take place in the gap, which may further lead to a flashover, hereinafter referred to as collector flashover. This may lead to tripping of the generator, thereby causing a forced outage.

According to currently existing techniques, periodic inspections of the generator are carried out for preventing collector flashovers. When damage to the collector rings or the brushes is detected, corrective action is taken to prevent collector flashovers. However, inspecting the generators frequently is inconvenient. Also, for every inspection, the generator needs to be shut down. The existing methods cannot predict a potential collector flashover while the generator is in operation.

Thus, there is a need for a system and method for a more efficient detection of collector flashovers.

BRIEF DESCRIPTION OF THE INVENTION

A system, method and computer program product for predicting collector flashover is disclosed. The method includes receiving a frame of measured data from a data acquisition system, fitting a statistical model to the measured data wherein the measured data includes a plurality of measured variables measured at multiple time instances. The statistical model and the measured data are used for estimating one or more parameters for the frame wherein the one or more parameters include at least one of field circuit impedance and field current noise. A flashover is predicted based, at least in part, upon the one or more estimated parameter for the frame.

The system for predicting flashover of an electrical generator collector includes a receiver module for receiving a frame of measured data corresponding to a plurality of measured variables, wherein the frame of measured data comprises the plurality of measured variables measured at multiple time instances. The system further includes a statistics module for fitting a statistical model to the measured data. Still further, the system includes an estimation module for estimating one or more parameters for the frame based upon the measured data and the statistical model, wherein the one or more parameters comprise at least one of field circuit impedance and field current noise. A flashover prediction module included in the system predicts a flashover condition of the electrical generator collector based, at least in part, upon the one or more estimated parameter for the frame.

DETAILED DESCRIPTION OF THE INVENTION

Figure 1:
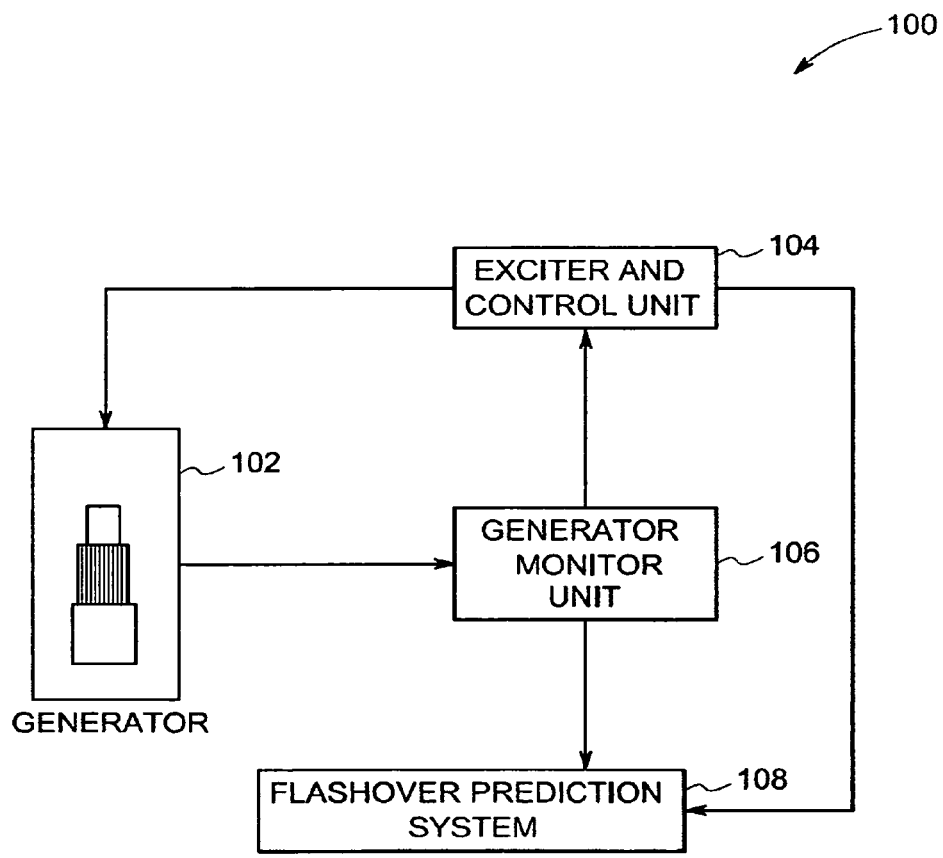
FIG. 1 is a block diagram of an environment in which embodiments of the present invention may be used.

Embodiments of the present invention provide methods, systems and computer program products for predicting a flashover condition in the collector of a generator. FIG. 1 shows an environment 100 in which various embodiments of the present invention will operate. The environment 100 includes a generator 102 that converts mechanical energy of a prime mover into electrical energy. In various embodiments, the generator 102 is a slip-ring type generator. The slip-ring type generator includes field windings wound on the rotor.

The field windings may be excited by an exciter and control unit 104. The exciter and control unit 104 includes an exciter such as, but not limited to, a DC generator, a battery, a rectified AC supply, or a static exciter. The static exciter feeds back a portion of the AC from each phase of generator output to the field windings, as DC excitations, through a system of transformers, rectifiers, and reactors. An external DC source may be used for initial excitation of the field windings. The exciter applies an excitation voltage, herein referred to as field voltage to the generator rotor, thereby causing a field current to flow through the field winding. Due to rotation of the field windings, the flux linked to stationary coils, disposed in a stator of the generator 102, varies in a sinusoidal fashion, causing a sinusoidal variation of voltage across the terminals of the stationary coils. The exciter and control unit 104 controls the operation of the generator 102. For example, the exciter and control unit 104 may control the field voltage, and field current supplied to the generator 102.

Typically, a slip-ring type generator 102 is provided with one or more collector ring and brush assemblies for continuous flow of field current in the field windings disposed on the rotor. For reasons mentioned above, a flashover may occur between the collector ring and the brush causing power failure. An object of the present invention is to predict a flashover condition so that preventive measures may be taken.

The environment 100 may further include a generator monitoring unit 106. The generator monitoring unit 106 may include a plurality of sensors for measuring one or more variables associated with the operation of the generator 102. The measured variables may include, without limitation, generated voltage, generated power, generated current, field voltage, field current, radio frequency (RF) signals, and the like. The generator monitoring unit 106 may communicate the measured variables to an exciter and control unit 104. Alternatively, the generator 102 may have sensors mounted thereon to measure variables such ozone concentration, visible and UV light emission, audible noise proximate to the collector ring and brush assemblies. The generator monitoring unit 106 may also measure these variables. Such variables may have a small magnitude under normal operating conditions, but may have prominent magnitudes in arcing and flashover events.

In one embodiment, the generator monitoring unit 106, the exciter and control unit 104, and the exciter may be included in an integrated excitation, control and monitoring system. Such an integrated excitation, control and monitoring system may be implemented using hardware such as, but not limited to, microcontrollers, microprocessors, logic circuits, and memories; and software modules stored on the memories.

According to embodiments of the present invention, the environment 100 also includes a flashover prediction system 108. The flashover prediction system 108 predicts an impending flashover condition so that an alarm may be flagged, a warning may be issued and/or a preventive action may be taken. Various embodiments of implementing the flashover prediction system 108 are described in detail in FIG. 2. In one embodiment, the flashover prediction system 108 may be deployed as a separate unit. In another embodiment, the flashover prediction system 108 may be part of the generator monitoring unit 106. In yet another embodiment, the flashover prediction system 108 may be part of the exciter and control unit 104. In one embodiment, the flashover prediction system 108 may be integrated within the integrated excitation, control and monitoring system described above.

Figure 2:
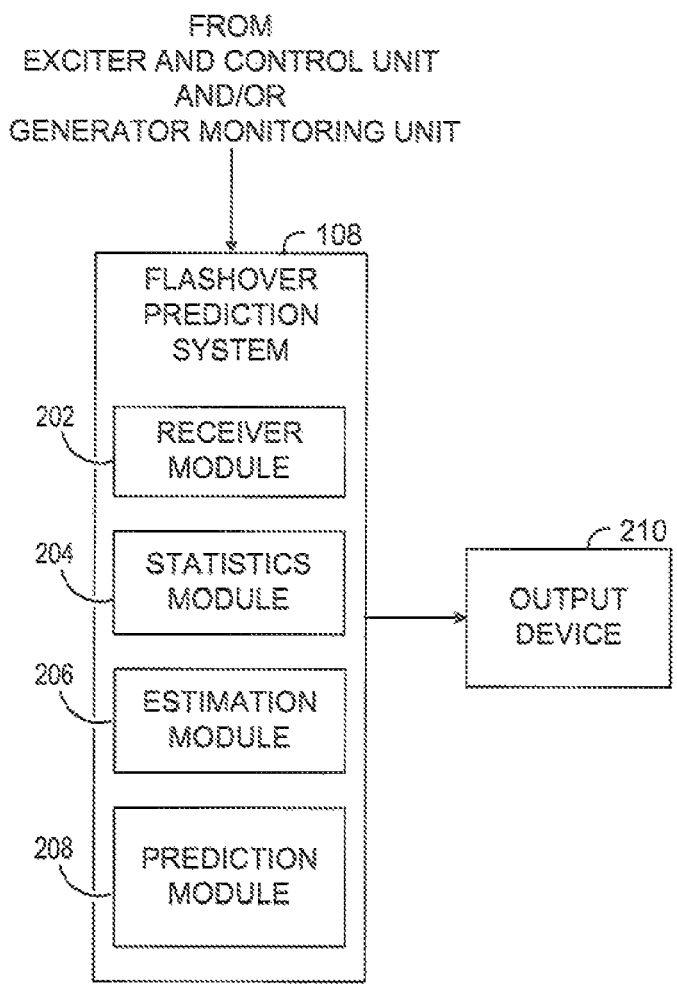
FIG. 2 is a block diagram of a flashover prediction system, in accordance with one embodiment.

FIG. 2 shows a detailed block diagram of the flashover prediction system 108, in accordance with an embodiment of the present invention. The flashover prediction system 108 includes a receiver module 202, a statistics module 204, an estimation module 206 and a prediction module 208.

The receiver module 202 may receive measured data from the exciter and control unit 104 and/or the generator monitoring unit 106. The measured data corresponds to a plurality of measured variables such as, but not limited to, the field current, the field voltage, the power consumed in the field of the generator 102, ozone concentration, visible and UV light emission, audible noise, and so forth. The receiver module 202 may receive the data through wired or wireless communication links. The receiver module 202 may obtain a frame of measured data corresponding to the plurality of measured variables. A frame of measured data may include a series of data points of the plurality of measured variables measured at predefined intervals. In an example implementation, the predefined intervals at which the variables are measured may be 1 second.

In one embodiment, the receiver module 202 may receive the data points at the predefined intervals. The receiver module 202 may store the data points in a memory, to form a frame of measured data. In another embodiment, the receiver module 202 may receive a complete frame of measured data. The generator monitoring unit 106 or exciter and control unit 104 may buffer the data points at the predefined intervals and transfer the frame of measured data.

The flashover prediction system 108 transfers the frame of measured data received by the receiver module 202 to the statistics module 204. The statistics module 204 fits a statistical model to the frame of measured data. In various embodiments, the statistics module 204 may divide the frame of measured data into a plurality of time windows, each of a fixed duration. The statistics module 204 may then fit a statistical model to the measured data of each time window. In other words, the statistics module 204 calculates the coefficients and intercepts of a curve that best fits the time series of data points of each time window. For example, the statistics module 204 may fit a straight line to the measured data of each time window, the straight line having the formula:

$$V = RI + \epsilon \qquad \text{Equation 1}$$

where, V is the field voltage, I is the field current, R is the field circuit resistance and $\epsilon$ is the noise.

The statistics module 204 may perform rolling window fitting on the frame of measured data. In other words, the statistics module 204 may fit the statistical model to one time window, then advance the time window by a predefined number of data points, for example, 1 data point, and then repeat process of fitting the statistical model. In one embodiment, successive time windows may be non-overlapping time windows. In other words, no data points are repeated in successive time windows. In another embodiment, successive time windows may be overlapping time windows. In other words, a predefined number of initial data points of one time window may be the final data points from the previous time window.

In one example implementation, the statistical model may be a linear regression model. The linear regression model may be obtained by any known linear regression method. In an embodiment, the linear regression method is a least squares regression method. In some other embodiments, the linear regression method may be one of least absolute deviation, maximum likelihood estimation, principal component regression, ridge regression, and so forth. The regression coefficients may also be obtained using Kalman filtering.

In one embodiment, the statistics module 204 may convert the received frame of measured data into a centered moving average time series of measured data. The statistics module 204 may then fit the statistical model to the centered moving average time series of measured data. In some other embodiments, the statistics module 204 may convert the received frame of measured data into a simple moving average time series of measured data.

The estimation module 206 then estimates one or more parameters based on the statistical model and the measured data. The parameters include, without limitation, field current noise and field impedance.

In one embodiment, the estimation module 206 may substitute at least one measured variable for each time instance of the time window into the statistical model for that time window. For example, the estimation module 206 may substitute the measured field voltage (independent variable V in Equation 1) for each time instance of the time window into the statistical model for that time window. The estimation module 206 may then compute a predicted value for one of the measured variables based on the substitution of the at least one other measured variable into the statistical model. For example, the estimation module 206 may compute a predicted value of the field current (dependent variable I in Equation 1) based on the substitution of the measured field voltage in Equation 1. The estimation module 206 may then compute the difference (referred to as "residue" herein) between the predicted value and the measured value of the dependent variable for all time instances of the time window. For example, the estimation module 206 may compute the residue of the field current at every time instance of the time window. The residue of the field current represents the field current noise. In one embodiment, the estimation module 206 may convert the residue at a given time instance to a percentage of the actual measured value at the given time instance of the time window.

In another embodiment, the estimation module 206 may record the coefficients of the statistical model, for example coefficient R in Equation 1. R represents the estimated value of field circuit resistance for a given time window. The variations in the estimated field circuit resistance may be used to predict a potential flashover condition. For example, drastic changes in the field circuit resistance from one time window to the next indicate that the brush contact pressure on the collector rings may not be optimal, and thus, a potential flashover condition may be impending.

The prediction module 208 may predict a potential flashover condition based on one or more of the parameters estimated by the estimation module 206. In some embodiments, the prediction module 208 may predict a potential flashover condition based on the residue of the parameters estimated by the estimation module 206. In some other embodiments, the prediction module 208 may directly employ the parameters estimated by the estimation module 206 to predict a potential flashover condition.

In one embodiment, the prediction module 208 compares the computed residues with a predefined threshold (for example, 1%). The prediction module 208 may then determine a density count denoting the number of occurrences of the residue exceeding the predefined threshold. The prediction module 208 may also determine an occurrence interval between successive occurrences of the residue exceeding the predefined threshold. The prediction module 208 may then compute the median value of the occurrence intervals. The prediction module 208 may then give an indication of the potential flashover condition based on the density count and/or the median value of occurrence interval. For example, the prediction module 208 may indicate a potential flashover condition if the density count exceeds 1% of the total number time instances for which the residue was computed and/or the median value of occurrence interval is less than 1 second.

In another embodiment, the prediction module 208 uses the residue converted to a percentage of the actual measured value in the above comparisons to predict the potential flashover condition.

In yet another embodiment, the prediction module 208 uses the estimated parameters in the above comparisons to predict the flashover condition. For example, the prediction module 208 may compare the estimated field circuit resistance with a predefined threshold, and determine the density count and the occurrence interval. The prediction module 208 may then indicate a potential flashover condition if the variation in the estimated field circuit resistance values exceeds the permissible amount of variation in the field circuit resistance.

If the prediction module 208 indicates a potential flashover condition a warning may be flagged. The flagged warning may be conveyed to an operator through an output device 210. In an embodiment of the present invention, the output device 210 may be an alarm or a flashing light source. Alternately, the output device 210 may be a display device displaying a warning message. In one embodiment, the output device 210 may be an interface linked to the exciter and control unit 104, which automatically shuts down the generator 102 upon indication from the prediction module 208 that a potential flashover condition exists.

Figure 3:
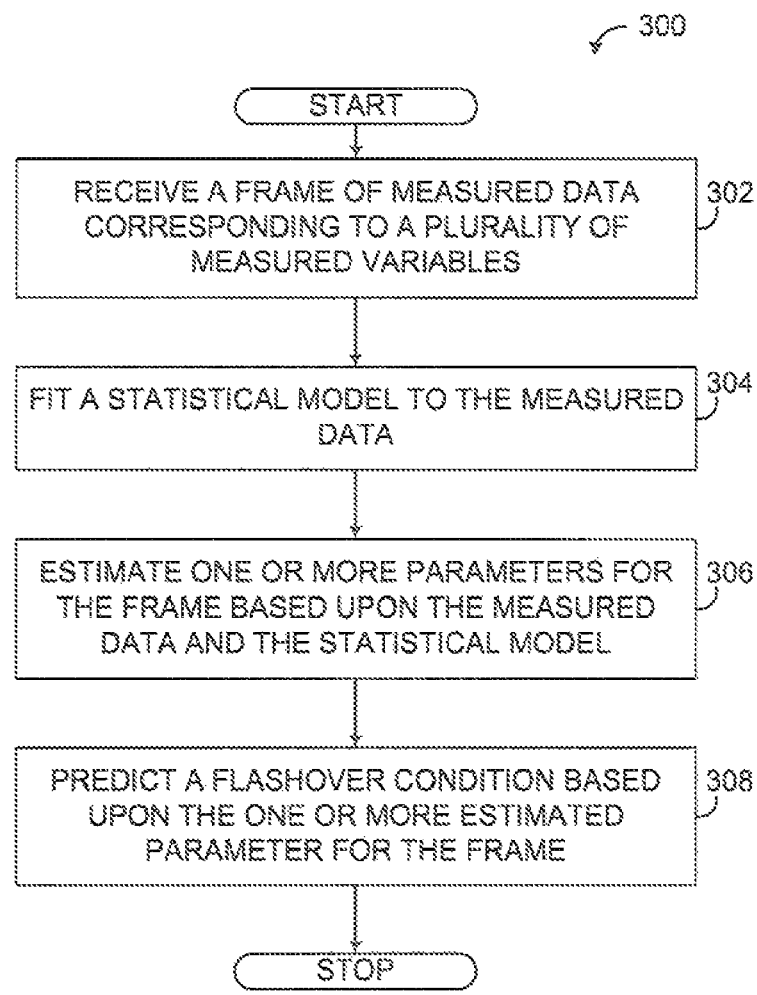
FIG. 3 is a flowchart illustrating an exemplary process of predicting a flashover condition in a generator, in accordance with one embodiment.

FIG. 3 is a flowchart illustrating an exemplary process 300 of predicting a flashover condition in the generator 102, in accordance with one embodiment of the present invention. In step 302, the flashover prediction system 108 receives a frame of measured data corresponding to one or more measured variables. A frame of measured data may include a time series of data points corresponding to one or more variables measured at predefined time intervals over a time window. The duration of the time window may depend on the specific requirements of the system. In an embodiment of the present invention, the time window may be of 10 minutes duration. The predefined intervals at which the variables are measured may be one second. The frame of measured data includes measured variables associated with operation of the generator 102. The measured variables may be at least one of the field current, field voltage, power consumed in the field of the generator 102, ozone concentration, visible and UV light emission, audible noise, and so forth.

In step 304, the flashover prediction system 108 fits a statistical model to the frame of measured data. In an embodiment, the model fitted to the measured data is a linear regression model.

The frame of measured data may be divided into a plurality of time windows. The plurality of time windows may be overlapping or non-overlapping. The flashover prediction system 108 may fit a statistical model to each of the plurality of time windows. The flashover prediction system 108 may then record the coefficients and intercepts of the statistical model for each time window. In an embodiment of the present invention the statistical model may be used to establish a functional relationship between field voltage and field current (for example Equation 1). In this case the coefficient of the statistical model represents the field circuit resistance R, and the intercept represents the noise $\epsilon$. In an embodiment of the present invention, a least squares method may be applied to determine the coefficients of the linear regression, though other techniques for determining the coefficients may also be used.

In step 306, the flashover prediction system 108 may estimate one or more parameters for the frame of measured data. The flashover prediction system 108 may substitute the measured variables in the statistical model to estimate the parameters such as, but not limited to, field circuit resistance, field current noise, ozone concentration, visible and UV light emission, audible noise, and so forth. Further the residue between the measured value and the predicted value of the dependent variable may be computed for all data points of the measured data.

In step 308, the flashover prediction system 108 may use the estimated parameters for predicting a flashover condition. One embodiment of implementing step 308 is explained in conjunction with FIG. 4. The steps of both FIG. 3 are repeated on a rolling window basis. Once the steps of process are executed on a specific time window of the current frame of measured data, the window is advanced forward by a predefined number of data points. In an embodiment the window may be advanced by one data point. Once all the data points of the current frame are analyzed, the next frame may be acquired and the steps of FIG. 3 may be repeated on the next frame.

Figure 4:
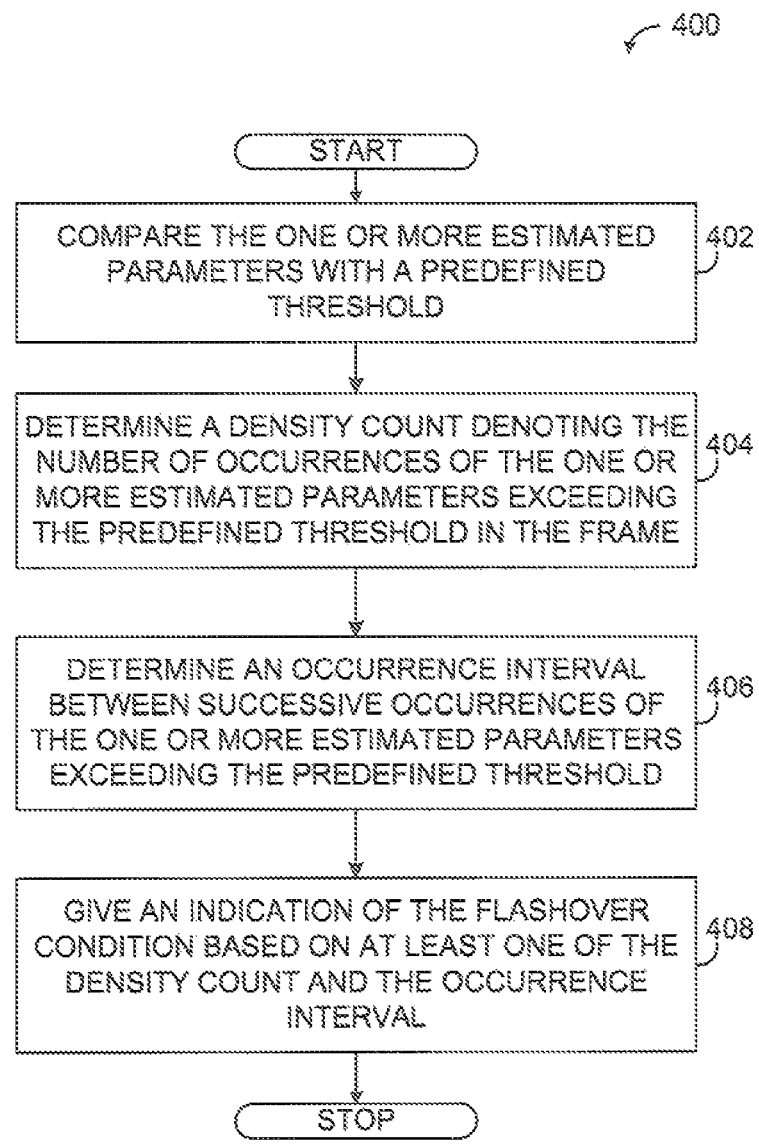
FIG. 4 is a flowchart illustrating an exemplary process of predicting a flashover condition in a generator, in accordance with another embodiment.

FIG. 4 shows a flow chart for implementing step 408 according to an embodiment of the present invention. In step 402, the one or more estimated parameters are compared with a predefined threshold. In an embodiment of the present invention, the predefined threshold may be 1 percent of the measured variable.

In step 404, a density count denoting the number of occurrences of the one or more parameters exceeding the predefined threshold is determined. In one embodiment, the density count may be converted to percentage of the total number of data points in the frame of measured data.

In step 406 an occurrence interval between successive occurrences when the one or more parameters exceed the predefined threshold are determined. In one embodiment, the median value of the occurrence intervals is calculated.

In step 408 a flashover is indicated based on the outcomes of at least one of steps 404, and 406. A flashover condition may be indicated if the density count is higher than a certain limit. In an embodiment of the present invention a flashover is indicated if the density count is higher that 1 percent of the total data points in the frame of measured data. A flashover is indicated only if the median of occurrence intervals obtained in step 406 is less than an occurrence limit. For example, the prediction module 208 may indicate a potential flashover condition if the density count exceeds 1% of the total number time instances for which the residue was computed and/or the median value of occurrence interval is less than 1 second.

In another embodiment, the prediction module 208 uses the residue converted to a percentage of the actual measured value in the above comparisons to predict the potential flashover condition.

In yet another embodiment, the prediction module 208 uses the estimated parameters in the above comparisons to predict the flashover condition. For example, the prediction module 208 may compare the estimated field circuit resistance with a predefined threshold, and determine the density count and the occurrence interval. The prediction module 208 may then indicate a potential flashover condition if the estimated field circuit resistance exceeds the density count limit and/or the estimated field circuit resistance exceeds the threshold more often than the median value of the occurrence interval.

Embodiments presented herein may also be implemented using a computer system such as, but not limited to, a microprocessor based system, a microcontroller based system, and so forth. Such a computer system may include a non-transitory computer readable medium including instructions which cause the computer system to perform the methods described in the figures above. The computer readable medium may be any one of a Random Access Memory (RAM), Read Only Memory (ROM), Programmable Read Only Memory (PROM), Erasable Programmable Read Only Memory (EPROM), optical discs, magnetic storage media, and the like.

Although the various embodiments of the present invention are described in conjunction with the generator 102, the embodiments may be applied to any other machine comprising a brush and collector ring assembly, such as a motor. The embodiments presented herein may be applied to any machine susceptible to failure due to a flashover in the collector.

The present invention has been described in terms of several embodiments solely for the purpose of illustration. Persons skilled in the art will recognize from this description that such embodiments may be practiced with modifications and alterations limited only by the spirit and scope of the appended claims.

The invention claimed is:

1. A method for predicting flashover of an electrical generator collector, the method comprising:
   buffering measured data corresponding to a plurality of measured variables measured at multiple discrete time instances over a determined time period to generate a frame of measured data using a generator monitoring unit, an exciter and control unit, or both the generator monitoring unit and the exciter and control unit;
   receiving the frame of measured data using a receiver module;
   fitting a statistical model to the frame of measured data by dividing the frame of measured data into a plurality of time windows and determining one or more coefficients of the statistical model using the measured data for each of the plurality of time windows using a statistics module;
   estimating one or more parameters for the frame based upon the measured data and the statistical model, wherein the one or more parameters comprise at least one of field circuit impedance and field current noise using an estimation module; and
   predicting a flashover condition of the electrical generator collector based, at least in part, upon the one or more estimated parameters for the frame using a flashover prediction module.

2. The method of claim 1, wherein the plurality of measured variables comprises two or more of field voltage, field current, field power dissipation, ozone concentration, visible and UV light emission, and audible noise.

3. The method of claim 1, wherein estimating the one or more parameters comprises:
   computing for each discrete time instance a predicted value for one measured variable of the plurality of measured variables using the statistical model and at least one other measured variable of the plurality of measured variables; and
   computing a difference between the predicted value and a corresponding measured value of the one measured variable for each discrete time instance.

4. The method of claim 1, wherein the statistical model comprises a linear regression model.

5. The method of claim 1, wherein predicting the flashover condition comprises:
   comparing the one or more estimated parameters with a predefined threshold;
   determining one or more of:
      a density count denoting a number of occurrences of the one or more estimated parameters exceeding the predefined threshold in the frame;
      an occurrence interval between successive occurrences of the one or more estimated parameters exceeding the predefined threshold; and
      generating an indication of the flashover condition based on at least one of the density count and the occurrence interval.

6. A system for predicting flashover of an electrical generator collector, the system comprising:
   a receiver module for receiving a frame of measured data corresponding to a plurality of measured variables, wherein the frame of measured data comprises buffered measured data corresponding to the plurality of measured variables measured at multiple discrete time instances over a determined time period;
   a statistics module for fitting a statistical model to the frame of measured data by dividing the frame of measured data into a plurality of time windows and determining one or more coefficients of the statistical model using the measured data for each of the plurality of time windows;
   an estimation module for estimating one or more parameters for the frame based upon the measured data and the statistical model, wherein the one or more parameters comprise at least one of field circuit impedance and field current noise; and
   a flashover prediction module for predicting a flashover condition of the electrical generator collector based, at least in part, upon the one or more estimated parameter for the frame.

7. The system of claim 6, wherein the plurality of measured variables comprises two or more of field voltage, field current, field power dissipation, ozone concentration, visible and UV light emission, and audible noise.

8. The system of claim 6, wherein the statistical model comprises a linear regression model.

9. A computer program product, comprising:
a non-transitory computer readable medium encoded with computer-executable instructions for predicting collector flashover, wherein the computer-executable instructions, when executed, cause one or more processors to:
   buffer measured data corresponding to a plurality of measured variables measured at multiple discrete time instances over a determined time period to generate a frame of measured data;
   receive the frame of measured data;
   fit a statistical model to the frame of measured data by dividing the frame of measured data into a plurality of time windows and determining one or more coefficients of the statistical model using the measured data for each of the plurality of time windows;
   estimate one or more parameters for the frame based upon the measured data and the statistical model, wherein the one or more parameters comprise at least one of field circuit impedance and field current noise; and
   predict a flashover condition based, at least in part, upon the one or more estimated parameters for the frame.

10. The computer program product of claim 9, wherein the plurality of measured variables comprises two or more of field voltage, field current, field power dissipation, ozone concentration, visible and UV light emission, and audible noise.

11. The computer program product of claim 9, further comprising computer executable instructions to cause the one or more processors to:
   compute for each time discrete instance a predicted value for one measured variable of the plurality of measured variables using the statistical model and at least one other measured variable of the plurality of measured variables; and
   compute a difference between the predicted value and a corresponding measured value of the one measured variable for each discrete time instance.

12. The computer program product of claim 9, further comprising computer executable instructions to cause the one or more processors to:
   compare the one or more estimated parameters with a predefined threshold;
   determine one or more of:
      a density count denoting a number of occurrences of the one or more estimated parameters exceeding the predefined threshold in the frame;
      an occurrence interval between successive occurrences of the one or more estimated parameters exceeding the predefined threshold; and
   generate an indication of the flashover condition based on at least one of the density count and the occurrence interval.

* * * * *